United States Patent [19]

Nakatani et al.

[11] Patent Number: 4,586,072
[45] Date of Patent: Apr. 29, 1986

[54] BIPOLAR TRANSISTOR WITH MESHED EMITTER

[75] Inventors: Yasutaka Nakatani, Yokohama; Isamu Kuryu, Kawasaki, both of Japan

[73] Assignee: Fujitsu Limited, Kawasaki, Japan

[21] Appl. No.: 402,425

[22] Filed: Jul. 28, 1982

[30] Foreign Application Priority Data

Jul. 28, 1981 [JP] Japan ................................ 56-118154

[51] Int. Cl.[4] .......................................... H01L 29/72
[52] U.S. Cl. ...................................... 357/34; 357/55; 357/36; 357/91; 357/51
[58] Field of Search ..................... 357/34, 55, 88, 45, 357/35, 36, 91, 63, 51

[56] References Cited

U.S. PATENT DOCUMENTS

| 3,500,143 | 3/1970 | Lamming | 357/34 |
| 3,560,814 | 2/1971 | Engbert | 357/34 |
| 3,582,723 | 6/1971 | Kerr | 357/34 |
| 3,600,646 | 8/1971 | Brackelmanns | 357/34 |
| 3,609,460 | 9/1971 | Ollendorf | 357/34 |
| 4,511,912 | 4/1985 | Mahrla | 357/34 X |

FOREIGN PATENT DOCUMENTS

| 8201103 | 4/1982 | PCT Int'l Appl. | 357/34 |
| 1062146 | 3/1967 | United Kingdom | 357/34 |

OTHER PUBLICATIONS

Nakatani et al., "An Ultra High Speed-Large Safe Operating Area Switching Power Transistor with New Fine Emitter Structure," Fifth International Telecommunications Energy Conference, 83 CHI855-6, IEE (1983).

Primary Examiner—Andrew J. James
Assistant Examiner—William A. Mintel
Attorney, Agent, or Firm—Staas & Halsey

[57] ABSTRACT

The present invention relates to a bipolar type semiconductor having the mesh emitter structure. The centers of intersections in said mesh emitter are hollowed and thereby parts of the base region are exposed. The internal base resistance can be reduced by employing such structure. Thereby, concentration of current into the centers of intersections of said mesh emitter at the time of turn-off can be prevented and the safe operating area of said semiconductor device can be enlarged. Moreover, the fall time of pertinent semiconductor device can be curtailed by reducing an internal base resistance and thereby the switching speed can be improved. In place of hollowing the intersections of the mesh emitter, the emitter regions in said intersections may be selectively shallowed, and furthermore opposite conductivity type regions may be formed within the emitter regions of said intersections.

6 Claims, 11 Drawing Figures

4,586,072

BIPOLAR TRANSISTOR WITH MESHED EMITTER

BACKGROUND OF THE INVENTION

1. Field of the Invention

This invention relates to a semiconductor device, particularly to a bipolar type transistor having a meshed plane pattern emitter region.

2. Description of the Prior Art

Bipolar type high power, high frequency transistors have been put into practical use in the form of overlay type transistors, mesh emitter transistors and ring emitter transistors.

Overlay type transistors are constructed of a plurality of emitter regions formed as islands in the vicinity of the base region surface and are connected in parallel by the electrodes.

Mesh emitter transistors have meshed emitter regions formed in the vicinity of the base region surface and electrodes are led from the intersections of the meshed portions.

Ring emitter transistors have a plurality of ring-shaped emitters deposited in the form of islands in the vicinity of the base region surface and the ring-shaped regions are connected in parallel by the electrodes.

In these high power, high frequency transistors, the periphery of the emitter region is made as large as possible in the limited base area in order to realize higher power and high frequency characteristics.

This invention relates to an improvement in high power and high frequency transistors having a mesh emitter structure. Such mesh emitter transistors have a structure as shown in FIG. 1. FIG. 1(b) is a sectional view of FIG. 1(a) taken along the line A—A'.

In FIG. 1, 1 is an N type silicon substrate forming the collector region; 2 is a P type base region which is formed by diffusing the acceptor impurity into the main surface of the silicon substrate 1 either selectively or over the entire surface; 3 is an N+ type emitter region formed by selectively diffusing the donor impurity into the P type base region 2. The N+ type emitter region 3 has the mesh type planar surface. Further, 4 is an insulating film, consisting of silicon dioxide ($SiO_2$), etc., covering the surface of the silicon substrate; 5 is the base leadout electrode; 6 is the emitter leadout electrode; and 7 is the collector electrode. In addition, 12a, 12b, ..., are base electrode windows provided in the insulating film 4 and 13a, 13b, ..., are emitter electrode windows provided in the insulating film 4. 14a, 14b, ..., are P+ type base contact regions (base compensating diffused regions).

A mesh emitter transistor having such a structure is often used as a switching regulator, DC-DC convertor because of its high speed switching characteristics. For applications such as a switching regulator and DC-DC convertor, however, the mesh emitter transistor is required to have a high breakdown voltage and a large safe operating area because it operates on a large current.

Consequently, the emitter strips of the mesh emitter transistor are widened to reduce the current density per unit area of the emitter region. When the emitter strips are widened, however, the sectional area of the base region is reduced due to the enlargement of the emitter region and a resistance of the base region under the emitter region 3, namely an internal base resistance rbb' in the direction from almost the center of the intersections of the emitter strip to the base contact region 14 (the direction along the line A—A' of FIG. 1(a)) increases.

Such an increase in the internal base resistance results in a deterioration of the switching speed of the mesh emitter transistor and causes part of the charge to remain just under the emitter strip during the switching operation. This is particularly so during turn-off, thereby causing a concentration of current and a resultant breakdown of the mesh emitter transistor.

SUMMARY OF THE INVENTION

It is an object of the present invention to provide a semiconductor device having a mesh emitter structure which can eliminate the disadvantages of conventional mesh emitter transistors.

It is another object of the present invention to provide a semiconductor device having a mesh emitter structure which has a high speed switching characteristic and also has a high breakdown voltage and a large safe operating area.

Accordingly, the present invention provides a semiconductor device comprising a collector region having a first conductivity type, a base region of a second conductivity type formed in the collector region and an emitter region of the first conductivity type formed in the base region, wherein the center area of the intersections in the mesh emitter region are made electrically inactive. As the means for making the center area of intersections of such mesh emitter regions electrically inactive, the following can be employed:

i. A part of the base region can be exposed by hollowing the centers of the intersections in the emitter region.

ii. The centers of the intersections in the emitter region can selectively be made to be thinner than the mesh emitter region.

iii. An opposing conductivity type region can be selectively deposited at the center of the intersections in the emitter region.

DESCRIPTION OF THE PREFERRED EMBODIMENTS

Figure 2A:
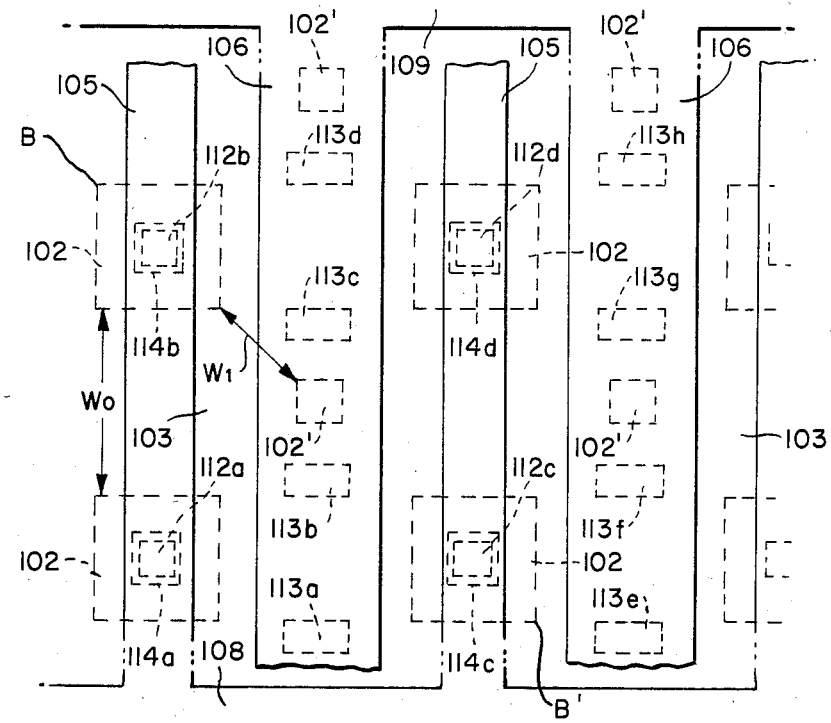
FIG. 2(a) is a plan view and FIG. 2(b) is a sectional view of the structure of a semiconductor device having a mesh emitter structure in accordance with the first embodiment of the present invention.
Figure 2B:
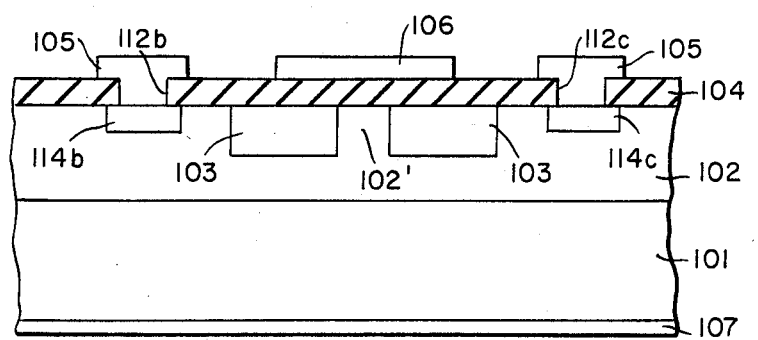

FIGS. 2(a) and 2(b) show the structure of the first embodiment of a semiconductor device of the present invention. FIG. 2(b) shows the sectional view of FIG. 2(a) taken along the line B—B'.

In FIGS. 2(a) and 2(b), 101 is an N type silicon (Si) substrate forming the collector region; 102 is a P type base region formed by diffusing, selectively or entirely, the acceptor impurity, for example, boron (B) into the main surface of the silicon substrate 101; 103 is an N+ type emitter region formed by selectively diffusing the donor impurity, for example, phosphorus (P) into the P type base region 102.

In the case of the first embodiment, the N+ type emitter region 103 has a mesh planar surface and the emitter region is not formed in the center of the intersections of the mesh structure. Therefore, a part 102' of the base region 102 is exposed. Namely, the centers of the intersecting areas of the emitter region 103 are hollowed.

An insulating film 104 consisting of silicon dioxide ($SiO_2$) covers the surface of silicon substrate. The base leadout electrode 105 consists of aluminum (Al), 106 is the emitter leadout electrode, also consisting of the aluminum, and 107 is the collector electrode. The plurality of base leadout electrodes 105 are connected in common to the base electrode pad 108, and the plurality of emitter leadout electrodes 106 are also connected in common to the emitter electrode pad 109. Further, 112a, 112b, . . . , are base electrode windows provided in the insulating film 104; 113a, 113b, . . . , are emitter electrode windows also provided in the insulating film 104. Additionally, 114a, 114b, . . . , are P+ type base contact regions (base compensating diffused region). In such a mesh emitter transistor, the emitter region is hollowed at the center of intersections of the mesh emitter region 103 as explained previously and a portion 102' of the base region is exposed.

In a mesh emitter transistor having this structure the base resistance in the base region 102' is sufficiently low because the base region 102' is thick and, therefore, the base resistance just under the emitter region 103, along the line B—B', is substantially equal to the resistance of base region 102 just under the emitter region 103. Therefore, according to such a structure, the internal base resistance rbb' can be drastically reduced as compared with that of the conventional structure.

With a reduction of the internal base resistance rbb', a semiconductor device having a mesh emitter structure is capable of realizing an improvement in switching speed. Further, when the internal base resistance rbb' is reduced, the amount of charge which remains in the area just under the emitter region 103 at the time of turn-off can also be reduced, thereby lowering the current concentration at the intersections of the emitter region 103.

Moreover, current which would be concentrated at the intersections of the emitter regions at the time of turn-off is diverged to the periphery of the emitter region 103 which is in contact with the base region 102'. Therefore, unlike the conventional structure, current is not concentrated at the intersections of the mesh emitter region, the safe operating area of the semiconductor device can be improved and the fall time when the device turns from ON to OFF can also be shortened.

Namely, a mesh emitter transistor having the structure shown in FIG. 2 is formed, wherein;

the specific resistance of the N type collector region 101 is 100 ohm-cm, the surface impurity concentration of the P type base region 102 is $5 \times 10^{18}$ atoms/cm$^3$, the depth of the P type base region 102 is 15 $\mu$m, the surface impurity concentration of the N+ type emitter region 103 is $1 \times 20^{12}$ atoms/cm$^3$, the depth of the N+ type emitter region 103 is 7.5 $\mu$m, the strip width of the N+ type emitter region 103 is 80 $\mu$m, the size of the aperture of the P type base region 102 is 70 $\mu$m in length $\times$ 70 $\mu$m in width, the size of the aperture of the P type base region 102' is 60 m in length $\times$ 60 $\mu$m in width, the thickness of the insulating film is 2$\mu$m, the thickness of the base leadout electrode 105 is 3 $\mu$m, the width of the base leadout electrode is 20 $\mu$m, the thickness of the emitter leadout electrode 106 is 3 $\mu$m, and the width of the emitter leadout electrode 106 is 25 $\mu$m.

Figure 1A:
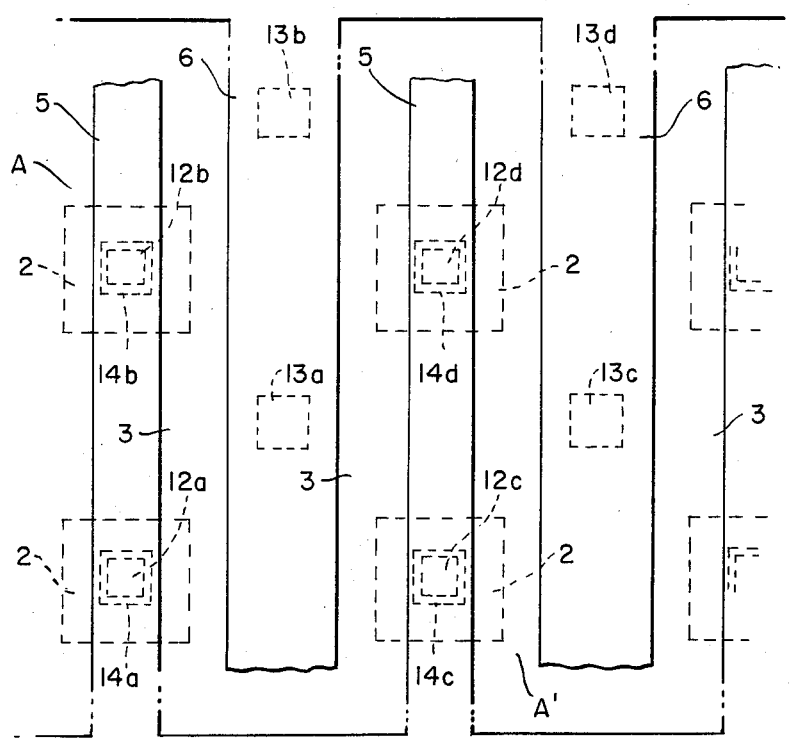
FIG. 1(a) is a plan view (a) and FIG. 1(b) is a sectional view of a conventional semiconductor device having a mesh emitter structure.
Figure 1B:
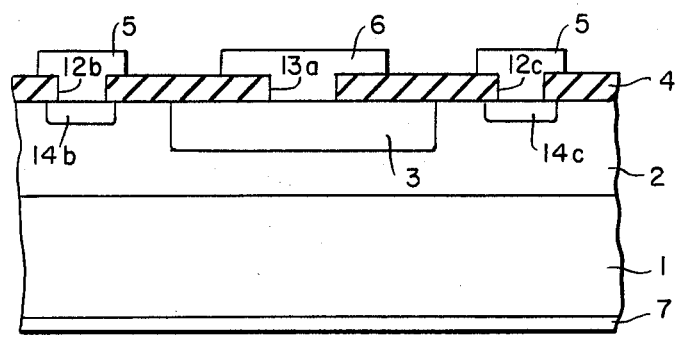

On the other hand, also formed is the mesh emitter transistor of the conventional structure shown in FIG. 1, wherein the specific resistance of the collector, the surface impurity concentration and the depth of the base region, the surface impurity concentration and the depth of the emitter region are equal to those of a transistor having the structure shown in FIG. 2.

Thus, the safe operating area in the reverse bias has been measured under the load of inductance (L) for a mesh emitter transistor of conventional structure and that of the present invention. The safe operating current of both transistors has been obtained with a load inductance of 1 mH and a collector-emitter voltage of 900 V. The safe operating current of the conventional mesh emitter transistor was 3 amperes, while that of the mesh emitter transistor of the present invention was 6 amperes. Namely, the safe operating area is increased by the present invention.

Figure 8:
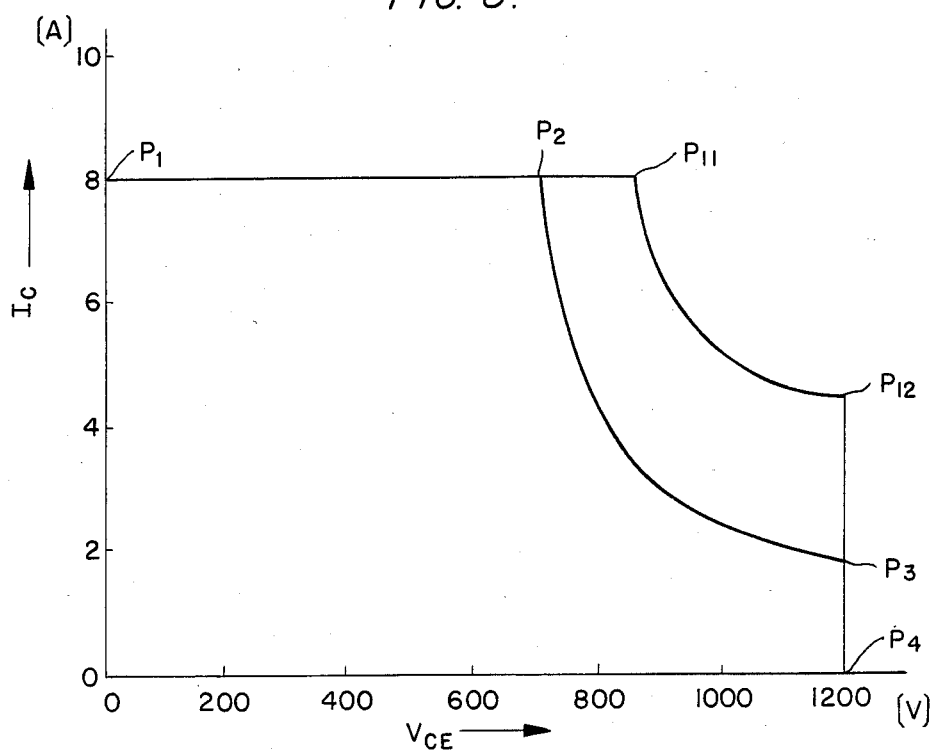
FIG. 8 is a graph of the safe operating areas of a conventional semiconductor device and of a semiconductor device in accordance with the present invention.

FIG. 8 shows the reverse bias safe operating areas of a conventional mesh emitter transistor and the mesh emitter transistor of the present invention.

In FIG. 8, the collector current (Ic) is plotted on the vertical axis, while the collector-emitter voltage ($V_{CE}$) is on the horizontal axis. The measuring conditions are as follows: the load inductance is 1 mH; the collector voltage is 60 V; the base current ($I_{B2}$) for pulling to OFF from ON is $-1$ ampere; and the base current for pulling to OFF from ON is about 5 V.

In FIG. 8 the area enclosed by the X axis, Y axis, and the lines connecting points $P_1$, $P_2$, $P_3$ and $P_4$ is the reverse bias safe operating area of the conventional mesh emitter transistor. The area enclosed by the X axis, Y axis, and the lines connecting points $P_1$, $P_{11}$, $P_{12}$, $P_4$ is the reverse bias safe operating area of the mesh emitter transistor of the present invention.

In addition, the fall time of the conventional mesh emitter transistor is 120 ns, while the fall time of the mesh emitter transistor of the present invention is 70 ns.

The present invention, therefore, realizes a drastic improvement in switching characteristics.

Accordingly, the present invention is capable of providing a semiconductor device ensuring excellent high speed switching characteristic and a large safe operating area which could not be obtained in the conventional mesh emitter transistor.

In the structure shown in FIG. 2, it is desirable to set the relation as follows:

$$W_1 > \tfrac{1}{2} W_o$$

Where, $W_1$: Width of emitter region in the direction from the hollowed portion of emitter region to the base contact region.

$W_o$: Width of emitter strip.

By adjusting $W_o$ and $W_1$, the situation where charges are left in the area just under the emitter strip can be prevented, except for the charges under the intersections at the time of turn-off operation.

Figure 3:
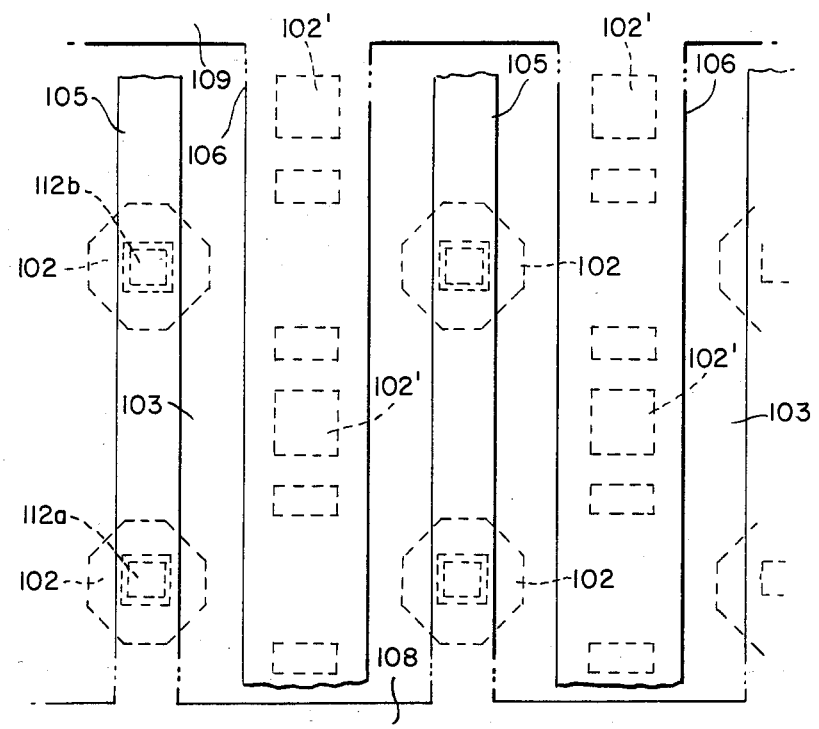
FIG. 3 is a plan view of the structure of a semiconductor device having a mesh emitter structure in accordance with the second embodiment of the present invention.

FIG. 3 shows the second emobidment of the semiconductor device of the present invention. In this figure, the portions corresponding to those in the embodiment of FIG. 2 are given the same numbering or symbols.

In the case of this embodiment, the intersections of the mesh emitter region are widened in the direction of the base electrode window 112. The emitter region increases its area because it is widened in the direction to the base electrode window, allowing the emitter current to increase. Thereby a semiconductor device for a higher power can be formed.

Figure 4:
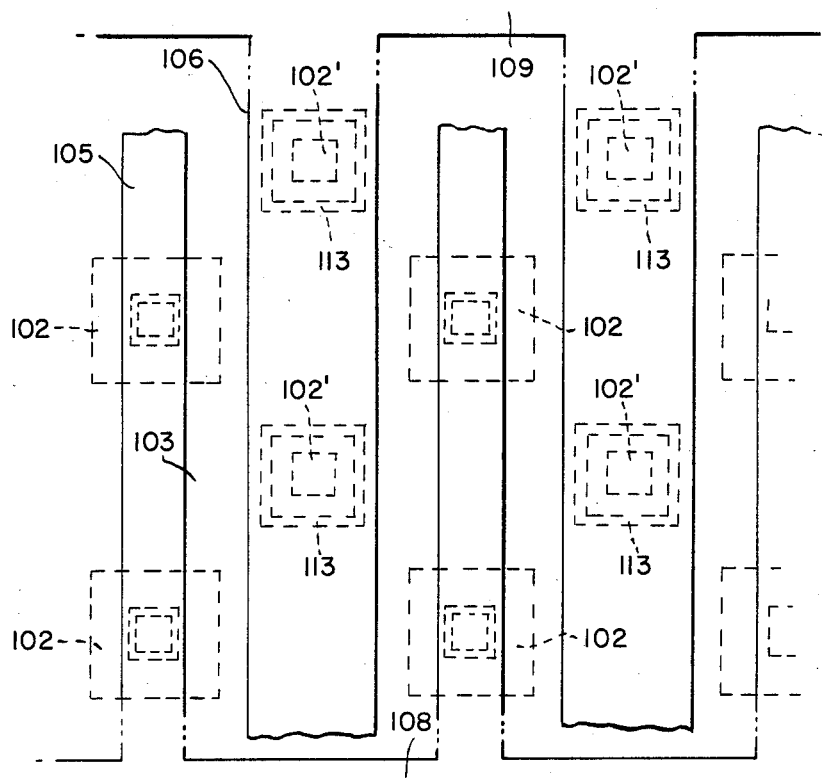
FIG. 4 is a plan view of the structure of a semiconductor device having a mesh emitter structure in accordance with the third embodiment of the present invention.

FIG. 4 shows the third embodiment of the semiconductor device of the present invention. In this figure, the portions corresponding to those in FIG. 2 are given the same numbering or symbols.

In this embodiment, the emitter electrode window 113 is formed in the insulating film 104 in such a manner so as to surround the base region 102'. With such a structure of the emitter electrode window connections between the emitter region and the emitter electrode can be made with a lower resistance.

Figure 5A:
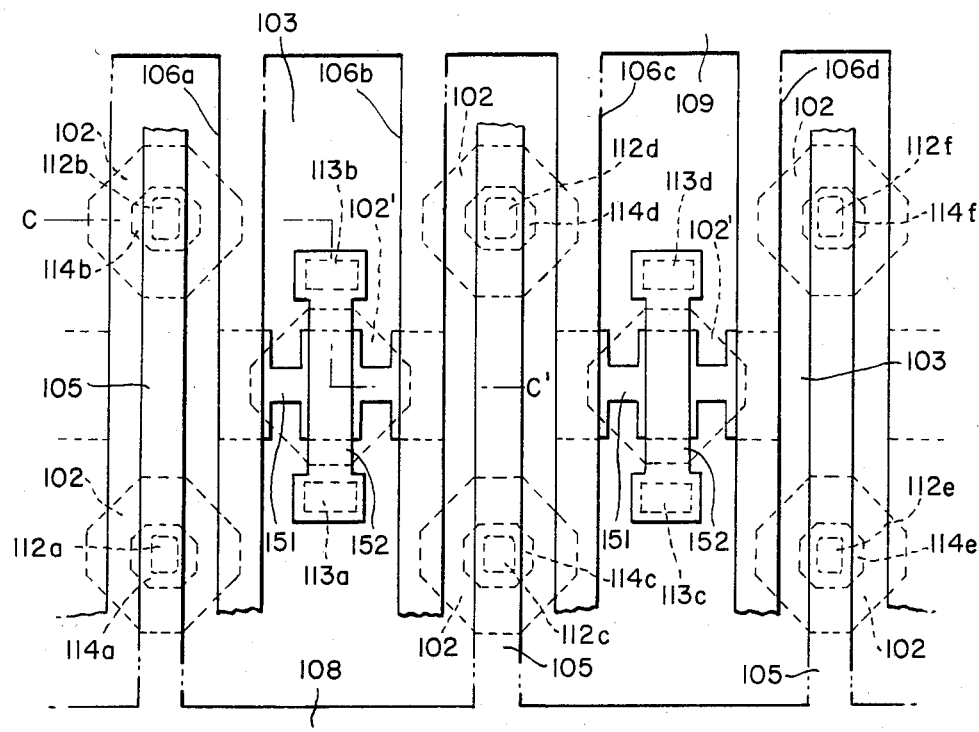
FIG. 5(a) is a plan view and FIG. 5(b) is a sectional view of the structure of a semiconductor device having a mesh emitter structure in accordance with the fourth embodiment of the present invention.
Figure 5B:
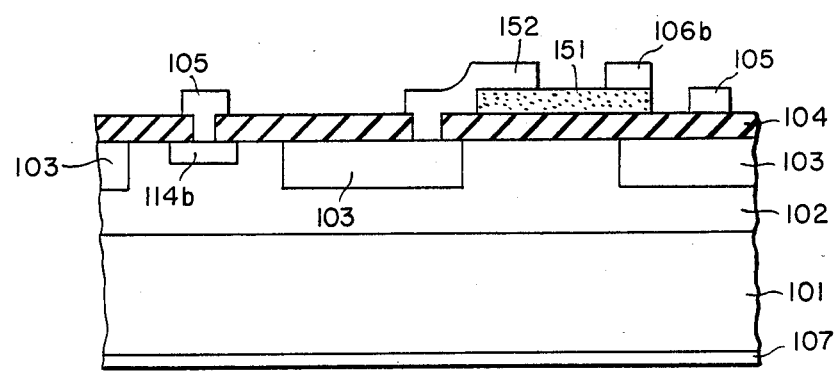

FIGS. 5(a) and 5(b) show the fourth embodiment of the semiconductor device of the present invention. FIG. 5(a) is a plan view and FIG. 5(b) is a sectional view along the lines C—C' in FIG. 5(a). In these figures, the portions corresponding to those in FIG. 2 are given the same numbering or symbols.

In this embodiment, emitter ballast resistors are deposited at the intersections of the mesh emitter region 103 and the emitter leadout electrode 106 is connected to the emitter region 103 via the emitter ballast resistors.

In the embodiment shown in FIG. 5, the base region 102' exposed at the center of the intersections in the mesh emitter region 103 has an octagonal planar surface and the exposed area of the base region 102 also has the octagonal shape.

In FIGS. 5(a) and 5(b), 151 is the emitter ballast resistor, consisting of, for example, polycrystalline silicon containing an impurity such as phosphorus or nichrome (Ni—Cr) etc.; 152 is the connecting conductor consisting of, for example, aluminum, connecting the emitter ballast resistor 151 and the emitter region 102 via the emitter electrode window 113. The ballast resistor 151 is provided and connected to the emitter electrodes (for example 106a and 106b) at both ends and also provided and connected with the connecting conductor 152 at its center area. The resistance value of the ballast resistor 151 is determined by selecting its thickness, width or impurity concentration.

In such a structure, the ballast resistor 151 is formed by depositing polycrystalline silicon including, for example, phosphorus (P), and then patterning the polycrystalline silicon utilizing photolithography. After the ballast resistor is formed, the base leadout electrode, emitter leadout electrode and connecting conductor are formed by depositing aluminum and then patterning the aluminum in accordance with the ordinary planar bipolar transistor producing processes.

In this case the ballast resistors 151 are arranged in the intersections of the mesh emitter region 103 in order to create a connection with the ballast resistor, between the emitter leadout electrode and the emitter region, the emitter region operates uniformly, in any portion, even when it operates on a large current, avoiding a concentration of current in a particular portion. Therefore, the semiconductor device does not breakdown because of the secondary breakdown phenomenon, assuring excellent high frequency characteristics, high speed switching characteristics, and a large, safe operating area. Moreover, it is not necessary to provide a new region for depositing the ballast resistor and, as a result, integration density is not deteriorated.

In the structure shown in FIG. 5, the polycrystalline silicon layer, for example, forming the ballast resistor 151 is partly in contact with the emitter region 106. But the present invention is not limited thereto. It is also possible to allow the resistance material, forming such a ballast resistor, to extend under the emitter electrode 106 and the emitter electrode pad 109. Extending the resistance material thereunder improves flatness in the semiconductor substrate surface and raises the accuracy of photoetching and production yield during the formation of the emitter electrode 106 and emitter electrode pad 109.

Figure 6:
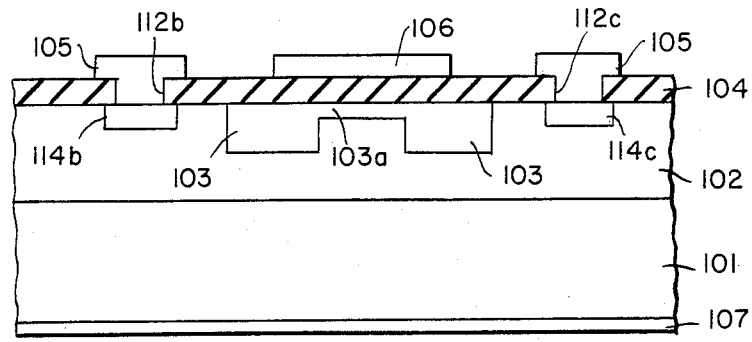
FIG. 6 is a sectional view of the structure of a semiconductor device having a mesh emitter structure in accordance with the fifth embodiment of the present invention.

FIG. 6 shows the fifth embodiment of the semiconductor device of the present invention. It indicates the same sectional view as FIG. 2(b). The portions corresponding to those in the embodiment of FIG. 2 are given the same numbering or symbols.

In this embodiment, the center of the intersection of the mesh emitter region is selectively shallowed. The shallowed emitter region 103a becomes electrically inactive in comparison to the surrounding emitter region 103. Moreover, the base region 102 under the emitter region 103a is enlarged (or deepened), and therefore, the base resistance in this area is small. Therefore, during the switching of the semiconductor device, the amount of charge remaining under the emitter region 103a is reduced and the current concentration in the intersections of the emitter region 103 is restricted.

Figure 7:
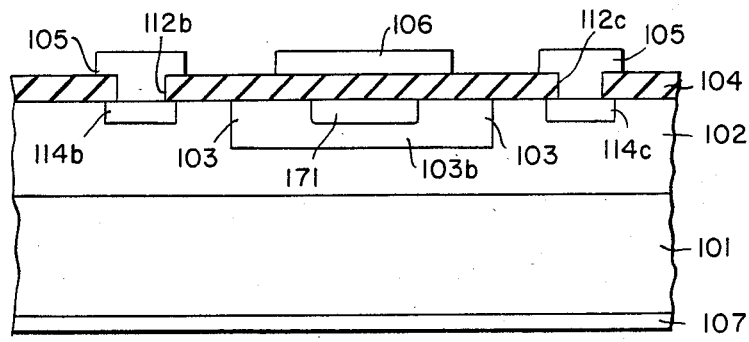
FIG. 7 is a sectional view of the structure of a semiconductor device having a mesh emitter structure in accordance with the sixth embodiment of the present invention.

FIG. 7 shows the sixth embodiment of the semiconductor device of the present invention. FIG. 7 is a sectional view similar to FIG. 2(b). In FIG. 7, the portions corresponding to those in FIG. 2 are given the same numbering or symbol.

In this embodiment, the opposite conductivity type regions (P type region) 171 are deposited, selectively, at the center of the emitter region in the intersections of the mesh emitter region. When the opposite conductivity type region 171 is deposited, the emitter region 103b under such opposite conductivity type region 171 becomes substantially inactive. Therefore, during the switching operation of a semiconductor device according to the present invention, a very small amount of charge remains in the area under the emitter region 103b and the current concentration at the intersections of the emitter region is restricted.

A semiconductor device in accordance with the present invention, as illustrated in FIG. 2 to FIG. 7, can be formed with the ordinary planar type bipolar transistor production method.

At this time, impurity concentration, the depth of the base region, the emitter region and collector region, and the thickness of the surface insulating film and the electrode material are selected by the power and frequency requirements of the pertinent semiconductor device.

According to the present invention as explained above, in a semiconductor device having the mesh emitter structure, a semiconductor device having high speed switching characteristics and a large safe operating area can be realized by exposing the base region without forming the emitter region at the center of the intersections in the mesh emitter region. Therefore, a reduction in size and weight of the switching power supply can be realized by introducing such a semiconductor device into the switching power supply.

We claim:

1. A semiconductor device, comprising:
   a collector substrate region having a first conductivity type;
   a base region formed in said collector region, and having a second conductivity type; and
   a mesh emitter region, of the first conductivity type, formed in said base region so that a plurality of first portions of the base regions are exposed by the mesh emitter region, and having a plurality of intersections defined by said mesh emitter region, each intersection having a center, said centers of said intersections in said mesh emitter region being made substantially electrically inactive.

2. A semiconductor device according to claim 1, wherein the centers of said intersections of said mesh emitter region are formed in said base region so that a plurality of second portions of the base region are exposed.

3. A semiconductor device according to claim 1, wherein said mesh emitter region has a thickness, said centers of said intersections of said mesh emitter region have a thickness, and said thickness of said centers of said intersections of said mesh emitter region are less than said thickness of said mesh emitter region.

4. A semiconductor device according to claim 1, wherein the mesh emitter region has a thickness and second conductivity type regions are formed at said centers of said intersections of said mesh emitter region, said second conductivity regions having a thickness which is less than the thickness of said mesh emitter region.

5. A semiconductor device according to claim 1, wherein the semiconductor device has a surface, further comprising an insulating film formed on the surface of the semiconductor device, a plurality of mesh emitter electrodes and a plurality of ballast resistors deposited on said insulating film at said centers of said intersections in said mesh emitter region, each ballast resistor having a first end and a second end, the first end of each ballast resistor being connected to said mesh emitter region, and the second end of each ballast resistor being respectively connected to one of said mesh emitter electrodes.

6. A semiconductor device according to claim 1, wherein the portions of the base region exposed through the mesh structure are substantially octagonal.

* * * * *